US011549825B2

(12) United States Patent
Roziere

(10) Patent No.: US 11,549,825 B2
(45) Date of Patent: Jan. 10, 2023

(54) CAPACITIVE DEVICE FOR DETECTING AN ELECTRICALLY FLOATING OBJECT

(71) Applicant: FOGALE SENSORS, Nîmes (FR)

(72) Inventor: Didier Roziere, Nîmes (FR)

(73) Assignee: FOGALE SENSORS, Nîmes (FR)

( * ) Notice: Subject to any disclaimer, the term of this patent is extended or adjusted under 35 U.S.C. 154(b) by 430 days.

(21) Appl. No.: 16/479,165

(22) PCT Filed: Jan. 9, 2018

(86) PCT No.: PCT/EP2018/050444
§ 371 (c)(1),
(2) Date: Jul. 18, 2019

(87) PCT Pub. No.: WO2018/134081
PCT Pub. Date: Jul. 26, 2018

(65) Prior Publication Data
US 2019/0346288 A1 Nov. 14, 2019

(30) Foreign Application Priority Data
Jan. 23, 2017 (FR) ..................................... 1750515

(51) Int. Cl.
*G01D 5/24* (2006.01)
*H03K 17/955* (2006.01)
*H03K 17/945* (2006.01)

(52) U.S. Cl.
CPC ......... *G01D 5/2405* (2013.01); *H03K 17/955* (2013.01); *H03K 2017/9455* (2013.01)

(58) Field of Classification Search
CPC ............... H03K 17/945; H03K 17/962; H03K 17/9622; H03K 17/975; H03K 2017/9604;
(Continued)

(56) References Cited

U.S. PATENT DOCUMENTS 6,859,141 B1 * 2/2005 Van Schyndel ...... H03K 17/955
324/688
7,839,282 B1 * 11/2010 Mathur ................ G01N 27/221
324/687
(Continued)

OTHER PUBLICATIONS

French Search Report from French Patent Application No. 1750515, dated Oct. 5, 2017.
(Continued)

*Primary Examiner* — Judy Nguyen
*Assistant Examiner* — Rahul Maini
(74) *Attorney, Agent, or Firm* — Greer, Burns & Crain, Ltd

(57) ABSTRACT

A device for detecting an object with respect to a detection surface including:
  a measurement electrode;
  at least one guard electrode, at the same alternating potential as the measurement electrode;
  at least one module for measuring a first signal with respect to the capacitance ($C_{eo}$), called electrode-object capacitance, formed between said measurement electrode and said object; and
at least one electrode, called polarization electrode, placed opposite the object, and polarized at the ground potential (G) so as to polarize the object by capacitive coupling.

12 Claims, 4 Drawing Sheets

(58) Field of Classification Search
CPC .......... H03K 2017/9615; H03K 2217/960705;
H03K 2217/960755; H03K 2217/960775;
H03K 2217/96073; H03K 2217/960745;
G01R 27/2605; G06F 1/3231; B60R
21/01532
USPC ........ 324/658, 662, 663, 665, 671, 672, 688
See application file for complete search history.

(56) References Cited

U.S. PATENT DOCUMENTS

| | | | |
|---|---|---|---|
| 10,318,032 B2 | 6/2019 | Bernard et al. | |
| 2006/0012944 A1* | 1/2006 | Mamigonians | H03K 17/975 361/303 |
| 2009/0076769 A1* | 3/2009 | Tokita | G01D 5/2405 702/150 |
| 2009/0146827 A1* | 6/2009 | Wuerstlein | H03K 17/955 340/657 |
| 2011/0115500 A1* | 5/2011 | Stanley | B60R 21/0152 324/661 |
| 2013/0181942 A1 | 7/2013 | Bulea et al. | |
| 2014/0239981 A1* | 8/2014 | Zibold | G01R 27/2605 324/680 |
| 2014/0360854 A1 | 12/2014 | Roziere | |
| 2017/0068352 A1 | 3/2017 | Blondin et al. | |

OTHER PUBLICATIONS

International Search Report from International Patent Application No. PCT/EP2018/050444, dated Apr. 6, 2018.

\* cited by examiner

CAPACITIVE DEVICE FOR DETECTING AN ELECTRICALLY FLOATING OBJECT

BACKGROUND

The present invention relates to a capacitive device for detecting an electrically floating object, or one in which the coupling with a reference potential such as a ground potential is insufficient or weak.

The field of the invention is, non-limitatively, that of interfaces for the capacitive detection of objects in order to detect objects in an environment or in contact with a detection surface.

Capacitive sensors currently existing make it possible to detect an object with respect to a detection surface, by measuring a signal representing the capacitance formed between a measurement electrode and the object.

These sensors comprise a series of measurement electrodes distributed in the plane of the detection surface. Each measurement electrode is guarded, by an electrode called guard electrode, polarized at an alternating potential, called guard potential, identical or substantially identical to the alternating potential of the measurement electrode at at least one working frequency, and different from a reference potential of the electronics, such as a ground potential. When the object is at a potential different from the guard potential, such as the ground potential, a capacitance, called electrode-object capacitance, forms between the measurement electrode and the object, representative of the distance between the detection surface and the object.

However, when the object to be detected is isolated from its environment, it is no longer linked to the ground potential and its electrical potential moves away from the ground potential. Furthermore, a coupling may then take place between the object and the measurement electrodes, so that the object is polarized with the guard potential and its potential moves even further away from the ground potential. In this case, the detection sensitivity and performance of the sensor are degraded. Such a situation can occur, for example, when the object is placed on the detection surface, such as a mattress or a table, and is electrically isolated from its environment or from the ground.

A purpose of the present invention is to overcome the abovementioned drawbacks.

Another purpose of the present invention is to propose a device for detection by capacitive effect making it possible to detect an object isolated from its environment, with greater accuracy, when the coupling of the object with the reference potential of the electronics or the ground potential is degraded.

Another purpose of the present invention is to propose a device for detection by capacitive effect making it possible to detect an object isolated from its environment, the detection sensitivity and performance of which are not degraded, when the coupling of the object with the reference potential of the electronics or the ground potential is degraded.

SUMMARY

At least one of these purposes is achieved with a device for detecting an object with respect to a detection surface, in particular when the coupling between said object and the ground potential, or the reference potential of the electronics of said device, is degraded or cut off, said device comprising:

at least one electrode, called measurement electrode, and at least one electrode, called guard electrode, placed opposite said measurement electrode, said measurement and guard electrodes being polarized at an alternating potential, called guard potential, identical or substantially identical at at least a given frequency, called working frequency, different from a ground potential, and at least one module for measuring a signal, called first signal, with respect to the capacitance, called electrode-object capacitance, formed between said measurement electrode and said object;

characterized in that it also comprises at least one electrode, called polarization electrode, placed opposite the object, and polarized at the ground potential so as to electrically polarize said object by capacitive coupling.

Thus, the method according to the invention makes it possible to polarize the object to be detected at the ground potential or at a reference potential of the electronics of the device according to the invention, with the polarization electrode or electrodes. Consequently, when the coupling between the object to be detected and said ground, or reference, potential is degraded or cut off, the potential of the object is brought to said ground (or reference) potential or to a potential close to said ground potential by the polarization electrode(s). Under these conditions, the object is detected by the measurement electrodes, with greater accuracy. Furthermore, by polarizing the object to be detected at the ground (or reference) potential, the detection sensitivity and performance of the device according to the invention are degraded less, or not at all, compared to the devices of the prior art.

In the present description, for the sake of brevity, the term "ground potential" denotes a reference potential of the electronics, which can be for example an electrical earth or a ground potential. This ground potential can correspond to an earth potential or to another potential, connected or not to the earth potential.

Furthermore it is noted that generally, objects which are not in direct electrical contact with a particular electrical potential (electrically floating objects) tend to polarize by capacitive coupling at the electrical potential of other objects present in their environment, such as for example earth or electrodes, if the surface areas of overlap between these objects and those of the environment (or the electrodes) are sufficiently large.

In the present application, two alternating potentials are identical at a given frequency when they each comprise an alternating component that is identical at this frequency. Thus, the at least one of the two potentials identical at said frequency can also comprise a continuous component, and/or an alternating component having a frequency different from said given frequency.

Similarly, two alternating potentials are different at the working frequency when they have no alternating component that is identical at this working frequency.

According to embodiments, the device according to the invention can comprise at least one polarization electrode, placed opposite or at the level of the detection surface, and polarized at the ground potential so as to electrically polarize, by capacitive coupling, said object located on the side of said detection surface.

According to an embodiment, at least one, in particular each, polarization electrode can be placed opposite, or at the same level as, the measurement electrode.

According to an embodiment, at least one, in particular each, polarization electrode can be placed opposite, or at the same level as, the guard electrode.

These embodiments have the advantage of limiting the number of layers of electrodes in the device according to the invention, and thus to reduce the space requirement of said device.

According to an embodiment, at least one, in particular each, polarization electrode can be placed below the guard electrode.

This embodiment reduces the production complexity.

Preferentially, the polarization electrode can be larger, or wider, than the guard electrode, itself wider than the measurement electrode.

This embodiment has improved detection sensitivity and performance since on the one hand the measurement electrode is effectively guarded by the guard electrode, and on the other hand the object is effectively polarized at the ground potential by the polarization electrode.

In all cases, it is important for the polarization electrode to have a surface opposite the object.

According to embodiments, the polarization electrode can be placed:
along only a part of the detection surface, and/or
outside or apart from the detection surface.

This configuration can make it possible for example to polarize an object that is extended with respect to the detection surface (for example a human body).

The device according to the invention can comprise a plurality of measurement electrodes distributed in the plane of the detection surface.

According to an embodiment, the device according to the invention can comprise an electrode switch making it possible to selectively connect one or more measurement electrodes, either to the measurement module in order to measure the capacitance, (active electrode), or to the guard potential in order to contribute to the guard elements.

Thus, a measurement module can be used in order to poll sequentially a plurality of measurement electrodes.

Alternatively or in addition, the device according to the invention can comprise switching means making it possible to switch one or more measurement electrodes to polarization electrodes.

In particular, the device according to the invention can comprise switching means making it possible to respectively connect the measurement electrode or electrodes either to:
the input of the measurement module (active electrode),
or to the guard,
or to the ground.

In particular, it is possible to create zones of measurement, guard, and polarization electrodes. These zones can be moved by switching each measurement electrode.

In particular, it is advisable to separate the polarization electrodes from the active measurement electrodes with the guard electrodes in order to minimize the coupling between the polarization and measurement electrodes.

According to an embodiment, at least one, in particular each, polarization electrode can be placed between two adjacent measurement electrodes, and/or between two adjacent guard electrodes.

In this case, the polarization electrode can have the form of a track or a thin electrode.

The polarization electrode can be placed, as indicated above, at the same level as, or below, guard electrodes.

According to an embodiment, the device can comprise, for at least one, in particular each, measurement electrode, an individual polarization electrode.

Alternatively, or in addition, the device according to the invention can comprise, for at least two, in particular all, the measurement electrodes, a common polarization electrode, in particular forming a ground plane.

According to an embodiment, the device can comprise, for at least one, in particular each, measurement electrode, an individual guard electrode.

Alternatively, or in addition, the device according to the invention can comprise, for at least two, in particular all, the measurement electrodes, a common guard electrode, in particular forming a guard plane.

According to a preferred embodiment, at least one, in particular each, polarization electrode can be openwork, and the guard electrode can be placed in the openwork part of said polarization electrode.

This embodiment has improved compactness and performance.

Advantageously, at least one, in particular each, of the measurement, guard and polarization electrodes can be produced from a transparent material.

For example, the electrode or electrodes can be produced for example from indium tin oxide (ITO).

The connecting tracks of at least one, in particular each, of the electrodes can also be transparent.

Moreover, the device according to the invention can comprise a calculation module arranged in order to calculate the electrode-object capacitance, formed between the measurement electrode and the object, as a function of the first signal.

The calculation of the electrode-object capacitance can be carried out as a function of the first signal measured, or as a function of a digitized version of said first signal measured, or another digital or analogue signal deduced from said first signal, for example by filtering said first signal at the working frequency.

The device according to the invention can also comprise at least one calculation module configured in order to determine a distance, or a contact, between the object and the detection surface as a function of the first signal, or of the electrode-object capacitance.

This calculation module can be, for example, the module for calculation of the electrode-object capacitance, or another calculation module.

The at least one calculation module can determine said distance, or said contact, by calculation or by comparison with a previously established reference table, from the first signal or from the electrode-object capacitance.

The at least one calculation module can determine said distance, or said contact, directly as a function of the first signal or of the electrode-object capacitance, and of a previously provided relationship.

According to a particularly advantageous version, the measurement electrode can be separated from the guard electrode by a distance that is elastically modifiable, in particular locally, by a load or a force exerted by the object on said detection surface.

In this case, the measurement electrode moves closer to the guard electrode when a load or a force is applied by the object on the detection surface. Furthermore, the distance separating the measurement electrode from the guard electrode depends on the load or the force exerted by the object on the detection surface.

In this advantageous version, according to an embodiment that is in no way limitative, the polarization electrode can be positioned at the level of the detection surface, and/or at the level of the measurement electrode.

According to another embodiment, the polarization electrode can be positioned at the level of, or opposite, the guard electrode.

In this advantageous version, according to an embodiment that is in no way limitative, the measurement electrode can be separated from the guard electrode by a layer that is elastically compressible, in particular locally, comprising, or formed by, a dielectric material.

The dielectric can be for example:
- a dielectric fluid: for example a dielectric gas such as air or nitrogen, a dielectric liquid such as oil, etc.;
- a dielectric polymer: for example a silicon-based polymer; or
- a dielectric foam: for example a foam made from polyester.

The separation layer can be transparent. To this end, it can be produced, for example, from flexible transparent plastic or from polydimethylsiloxane (or PDMS) comprising a dielectric, itself transparent.

According to an embodiment, the electrodes can be placed in said dielectric separation layer.

For example:
- the measurement electrode or electrodes can be placed in the separation layer, on the side of a wall delimiting said separation layer on the side of the detection surface. In particular, the measurement electrode or electrodes can be placed firmly fixed to said wall, for example placed on said wall; and/or
- the polarization electrode or electrodes can be placed in the separation layer, on the side of a wall delimiting said separation layer on the side of the detection surface, or on the side of a wall delimiting said separation layer on the side opposite the detection surface. In particular, the polarization electrode or electrodes can be placed firmly fixed to said wall, for example placed on said wall; and/or
- the guard electrode or electrodes can be placed in the separation layer, on the side of a wall delimiting said separation layer on the side opposite the detection surface. In particular, the guard electrode or electrodes can be placed firmly fixed to said wall, for example placed on said wall.

The measurement, guard and polarization electrodes can be produced for example:
- from printed circuit boards forming electrodes and flexible or rigid metallic tracks (PCB);
- from a deposit of conductive ink, deposited for example with a screen printing or ink jet process, on a surface of dielectric material;
- from layers of metallic materials such as copper, silver or other conductive materials such as carbon or metal oxides (indium tin oxide or ITO, zinc oxide or ZnO) deposited by a vacuum deposition process or etched by an etching process;
- with conductive polymers;
- in the form of fabric or layers of fabric, with wires made from conductive material (metal, etc.) woven or knitted etc.

The device according to the invention can also comprise a measurement module arranged in order to measure a signal, called second signal, with respect to the capacitance, called inter-electrode capacitance, formed between the measurement electrode and the guard electrode, said guard electrode being polarized beforehand at a potential different from the alternating potential of the measurement electrode.

Such a measurement module can be the measurement module of the first signal. Alternatively, such a measurement module can different from the measurement module of the first signal.

Moreover, the device according to the invention can comprise a calculation module arranged in order to calculate the inter-electrode capacitance, formed between the measurement electrode and the guard electrode, as a function of the second signal.

The calculation of the inter-electrode capacitance can be carried out as a function of the second signal measured, or as a function of a digitized version of said second signal measured, or also as a function of a digital or analogue signal deduced from said second signal, for example by filtering or any other analogue or digital processing.

The device according to the invention can also comprise at least one calculation module configured in order to determine a load or a force applied by the object on the detection surface as a function of the second signal, or of the inter-electrode capacitance.

This calculation module can be, for example, one of the calculation modules described above, or another calculation module.

The at least one calculation module can determine said load, or said force, by calculation or by comparison with a previously established reference table, from the second signal or from the inter-electrode capacitance.

The at least one calculation module can determine said load or said force, directly as a function of the second signal or from said inter-electrode capacitance, and from a previously assigned relationship.

According to yet another aspect of the invention, a detection layer is proposed for an item of equipment, equipped with a detection device according to the invention.

The detection device according to the invention, in particular the electrodes, is (are) able to be integrated in the detection layer.

The detection layer can be integrated in the item of equipment.

Alternatively, the detection layer can be independent of the item of equipment and attached to this item of equipment.

According to yet another aspect of the invention, an item of equipment is proposed equipped with a detection layer according to the invention.

According to embodiments, the item of equipment can comprise, or be in the form of, a support for receiving a person in a seated or lying position.

Such an item of equipment can be an item of furniture for receiving a person in a seated position, such as a chair, or an armchair, in particular a wheelchair.

Such an item of equipment can be an item of furniture for receiving a person in a lying position, such as an operating table or a medical imaging table, a trolley, etc.

Non-limitatively, the detection layer can then be presented in the form of a mattress or a foam material, or also a drawsheet, a protective cover or sheet, for an item of equipment comprising a support for receiving a person in a seated or lying position, such as a bed, a table, a chair, an armchair, or a wheelchair.

The object to be detected can be for example a human body or a part of a human body. In particular, the object to be detected can be a person located in a lying position on the detection surface, or in a seated position on/against the detection surface.

According to embodiments, the item of equipment can comprise, or be in the form of, an electronic appliance, such as for example a part of a robot or a robot.

Non-limitatively, the detection layer can be placed on, or integrated in, a surface or a casing of the appliance.

The detection layer can have the form of a trim element or a skin.

The detection layer can have in particular the form of a trim element, such as a textile trim, independent of said appliance.

The detection layer can also have the form of a skin (or "sensitive skin") making it possible to cover all or part of a robot for example of humanoid form. This skin can be designed so as to have an appearance (colour, surface, touch etc.) close to that of human skin.

The detection layer can also have the form of a trim part or element that is tubular in shape, suitable for being placed for example around a limb or a portion of a limb of a robot.

BRIEF DESCRIPTION OF THE DRAWINGS

Other advantages and characteristics will become apparent on examination of the detailed description of non-limitative examples and from the attached drawings in which.

DETAILED DESCRIPTION

It is well understood that the embodiments that will be described hereinafter are in no way limitative. In particular, variants of the invention may be envisaged comprising only a selection of characteristics described hereinafter, in isolation from the other characteristics described, if this selection of characteristics is sufficient to confer a technical advantage or to differentiate the invention with respect to the state of the prior art. This selection comprises at least one, preferably functional, characteristic without structural details, or with only a part of the structural details if this part alone is sufficient to confer a technical advantage or to differentiate the invention with respect to the state of the prior art.

In particular, all the variants and all the embodiments described may be combined together if there is no objection to such combination from a technical point of view.

In the figures, elements that are common to several figures retain the same reference.

Figure 1:
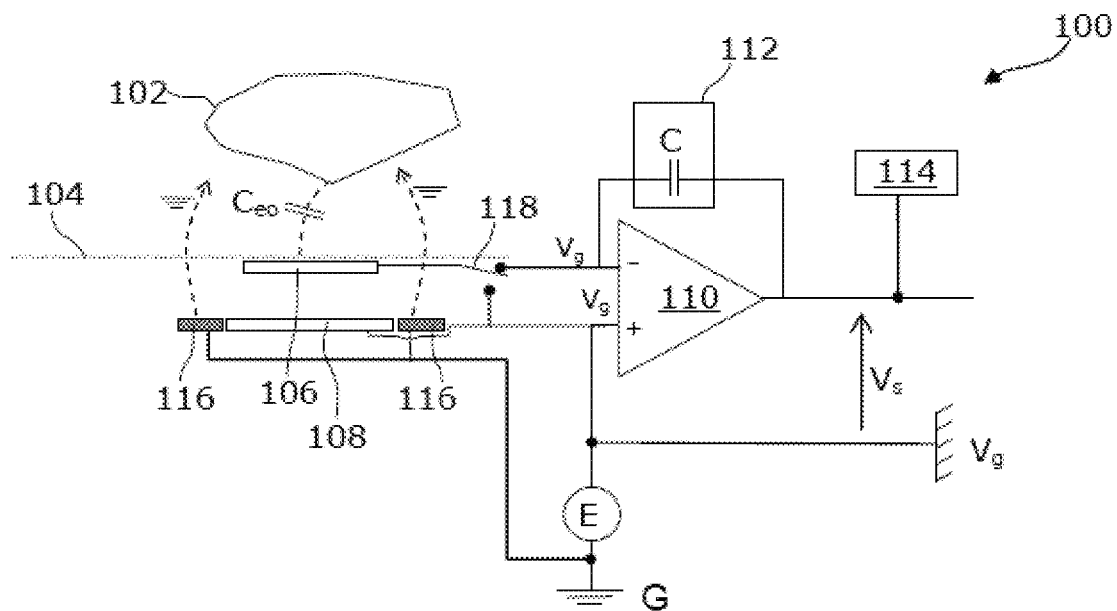
FIG. 1 is a diagrammatic representation of the electrical principle of a first non-limitative embodiment example of a device according to the invention.

FIG. 1 is a diagrammatic representation of the electrical principle of a first non-limitative embodiment example of a detection device according to the invention.

The device 100, shown diagrammatically in FIG. 1, is intended to detect the approach and the contact of a control object 102 with respect to a detection surface 104.

The device 100 comprises at least an electrode 106, called measurement electrode, placed facing the detection surface 104, and therefore the object 102 approaching said surface 104, and an electrode 108, called guard electrode, placed facing the measurement electrode 106, below and at a distance from the measurement electrode 106.

The device 100 also comprises a charge amplifier formed by an operational amplifier (OA) 110, the output of which is looped on its negative input by an impedance 112, which can be a capacitor or a capacitor combined with a resistor. In the example shown, the impedance 112 is formed by a capacitor C.

A digital or analogue module 114, connected to the output of the OA 110, measures a voltage, denoted $V_s$, on the output of the OA 110 at a working frequency.

The device 100 also comprises an electrical source E, called guard electrical source, supplying an alternating potential, called guard potential, denoted $V_g$, different from an electrical ground, denoted G and having a frequency equal to the working frequency.

In the example shown in FIG. 1:
the measurement electrode 106 is connected to the negative input of the OA 110, and
the guard electrode is connected to the positive input of the OA; and
the electrical source E is connected to the positive input of the OA 110.

In this configuration, the measurement electrode 106 and the guard electrode 108 are at the same (or substantially the same) alternating potential $V_g$, supplied by the source E.

Thus, the guard electrode 108 protects the measurement electrode 106 from the unwanted capacitive couplings with the environment and prevents the appearance of leakage capacitances.

Moreover, the detection electronics and in particular the OA 110 are preferably supplied with power by an electric power supply referenced to the guard potential $V_g$, in order to avoid leakage capacitances at the level of the electronics.

Alternatively, of course, the detection electronics and in particular the OA 110 can be supplied by an electric power supply referenced to the ground potential.

The voltage $V_s$ measured by the measurement module 114 is proportional to the capacitance $C_{eo}$, called electrode-object capacitance, formed between the measurement electrode 106 and the object 102. In particular, the voltage $V_s$ measured verifies the following relationship:

$$V_s = E \frac{C_{eo}}{C} \quad (1)$$

Thus, it is possible to deduce the capacitance $C_{eo}$ from the measured signal $V_s$.

Furthermore, the capacitance $C_{eo}$ is directly a function of the distance separating the object 102 from the measurement electrode 106, and thus from the detection surface 104. Consequently, it is possible to deduce the distance between the object 102 and the detection surface as a function of the value of the capacitance $C_{eo}$, and more generally as a function of the signal $V_s$.

The device 100 also comprises another electrode 116, called polarization electrode. The polarization electrode 116 is connected to the electrical ground G and makes it possible to polarize the object 102 with the ground potential G, so as to retain the detection sensitivity and performance of the device 100, when the coupling between the object 102 and the ground potential G is degraded or cut off. Such a situation can take place when the object 102 is only in contact with the detection surface 104 or when the object 102 has no direct or indirect contact with earth, other than via the detection surface 104.

In the example shown, the polarization electrode 116 is openwork and the guard electrode 108 is placed in the openwork part of the polarization electrode 116, with no contact with said polarization electrode 116. Thus, the polarization electrode 116 and the guard electrode 108 are placed at the same level.

The polarization electrode 116 is larger than the guard electrode 108, itself larger than the measurement electrode 106.

Moreover, the device 100 comprises a controllable switch 118 making it possible to connect the measurement electrode 106:
- either to the negative input of the OA 110: in this case the measurement electrode 106 is called "active" and makes it possible to measure a signal with respect to the capacitance $C_{eo}$;
- or to the guard potential $V_g$, present for example at the positive input of the OA: in this case, the measurement electrode 106 is connected to the same guard potential $V_g$ as the guard electrode 108 and becomes a guard electrode.

Thus it is possible to poll sequentially a plurality of measurement electrodes 106, either individually or by group.

Figure 2:
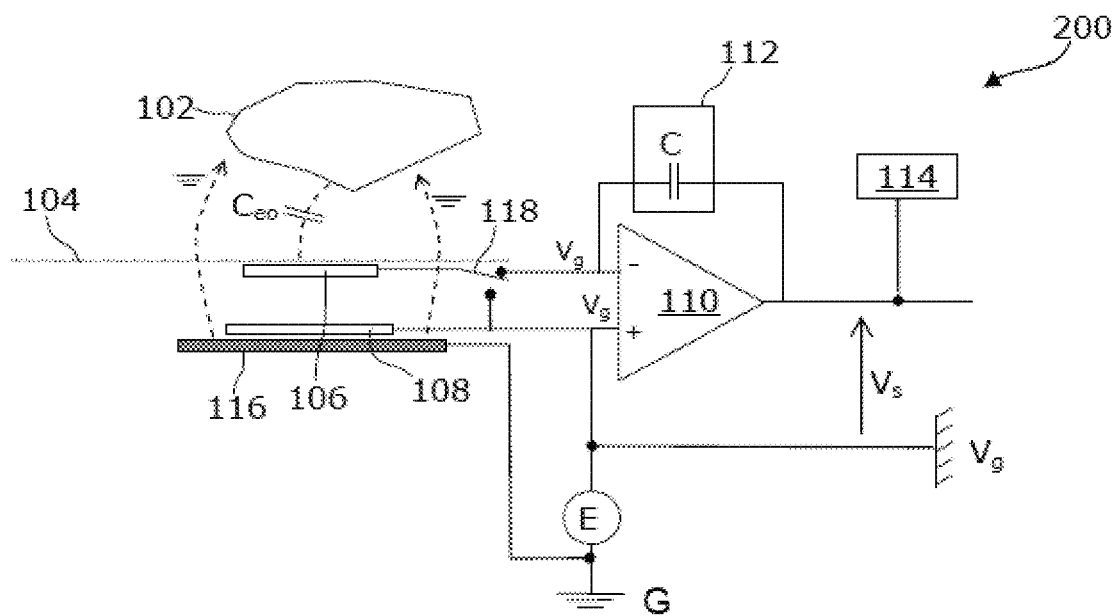
FIG. 2 is a diagrammatic representation of the electrical principle of a second non-limitative embodiment example of a device according to the invention.

FIG. 2 is a diagrammatic representation of the electrical principle of a second non-limitative embodiment example of a detection device according to the invention.

The device 200, shown in FIG. 2, comprises all the elements of the device 100 in FIG. 1.

In the device 200, unlike the device 100 in FIG. 1, the polarization electrode 116 is not openwork, and is placed below the guard electrode 108, seen from the measurement electrode 106.

Figure 3A:
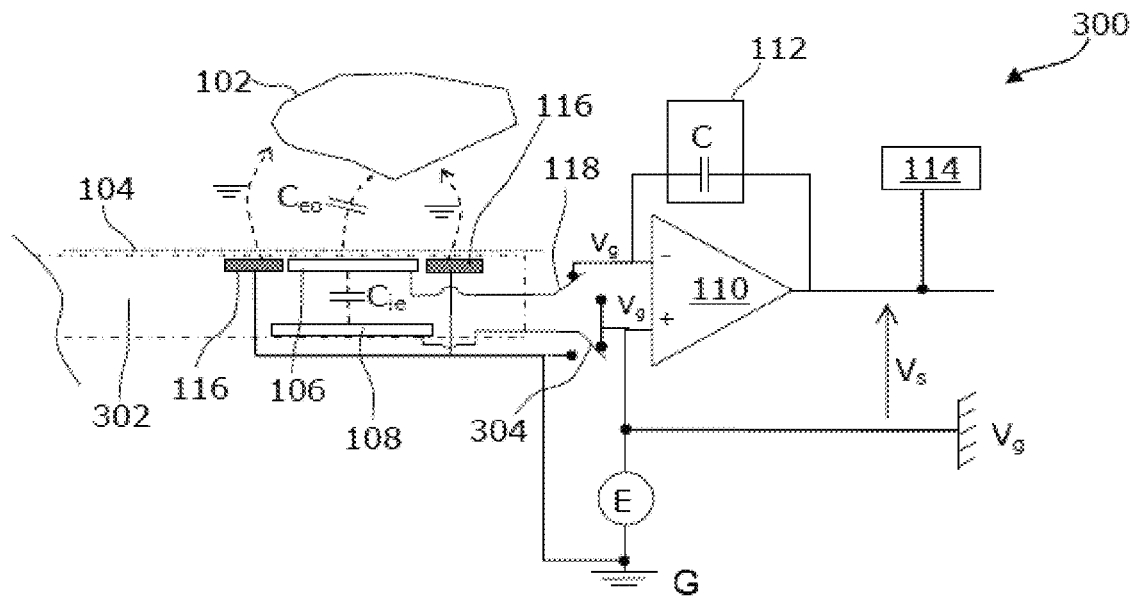
FIGS. 3a-3b are diagrammatic representations of the electrical principle of a third non-limitative embodiment example of a device according to the invention.
Figure 3B:
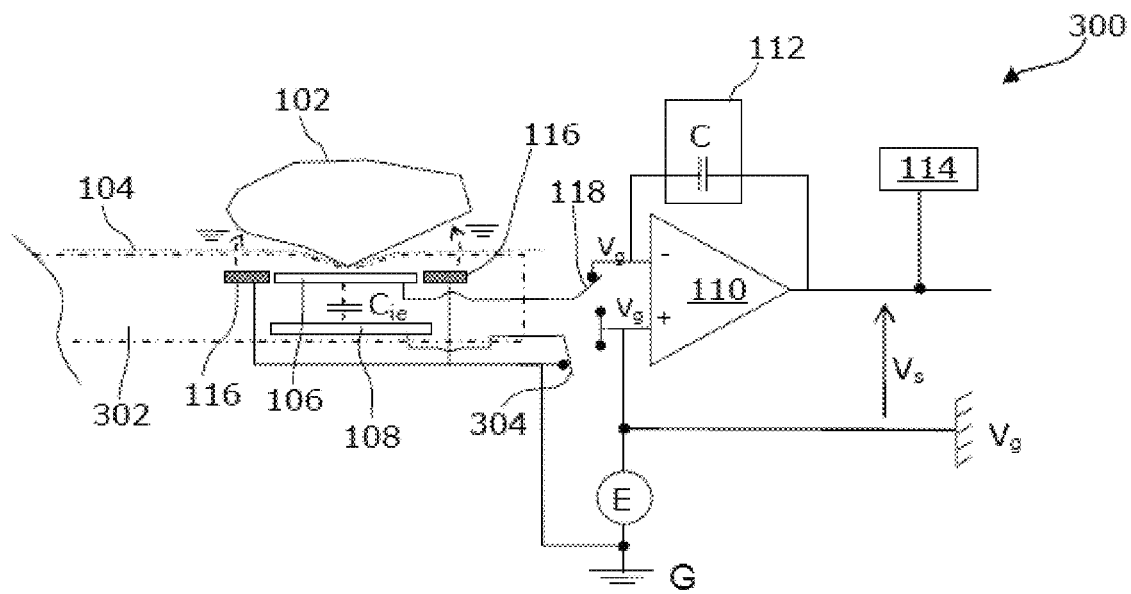

FIGS. 3a-3b are diagrammatic representations of the electrical principle of a third non-limitative embodiment example of a detection device according to the invention.

The device 300, shown in FIGS. 3a-3b, is intended to detect the approach, the contact and also the pressure exerted by the control object 102 on the detection surface 104.

The object 102 is on approach and at a distance from the detection surface 104 in FIG. 3a, exerting pressure on the detection surface 104 in FIG. 3b.

The device 300 comprises all the elements of the device 100 in FIG. 1.

Unlike in FIG. 1, the openwork polarization electrode 116 is placed at the same level as the measurement electrode 106. Such an architecture makes it possible to minimize the unwanted capacitances during the measurements, in particular in the case where the polarization electrode 116 is distanced from the measurement electrode 106 by a distance comparable to or greater than the separation between the measurement 106 and guard 108 electrodes. In this case the guard 108 plays the role of separation guard between the measurement electrode 106 and the polarization electrode 116, even if it is not on the same plane.

Furthermore, in the device 300, the measurement 106, guard 108 and polarization 116 electrodes are placed in a layer 302 that is elastically compressible, filled with a dielectric, such as for example foam or plastic or also a liquid dielectric of the oil type, or also a gaseous dielectric of the air or nitrogen type.

In particular, the measurement electrode 106 and the polarization electrode 116 are firmly fixed to the wall of the layer 302 on the side of the detection surface 104, and are for example placed on said wall.

The guard electrode 108 is firmly fixed to the wall of the layer 302 on the side opposite the detection surface 104, and is for example placed on said wall.

Thus, the distance between the measurement electrode 106 and the guard electrode 108 can be elastically modified, locally, by a load exerted by the control object 102 on the detection surface 104. In particular, when a load is applied on the detection surface 104, the measurement electrode 106 moves closer to the polarization electrode 116, as shown in FIG. 3b.

The device 300 also comprises a controllable switch 304 making it possible to connect the guard electrode 108:
- either to the guard potential $V_g$, present for example at the positive input of the OA 110: in this case, the guard electrode 108 is polarized at the guard potential $V_g$;
- or to the electrical ground potential G.

Under these conditions, the approach and the contact of the object 102 with the detection surface 104 are detected as a function of the value of the capacitance $C_{eo}$ formed between the measurement electrode 106 and the control object 102. The electrode-object capacitance $C_{eo}$ is determined as described above, with reference to FIG. 1 for example.

The device 300 also makes it possible to measure the load exerted by the object 102 on the pressure surface 104 by measuring a signal, called second signal, representative of a capacitance $C_{ie}$, called inter-electrode capacitance, formed between the measurement electrode 106 and the guard electrode 108. This inter-electrode capacitance $C_{ie}$ is determined in the following manner:
- the measurement electrode 106 remains connected to the negative input of the OA 110: in this configuration the measurement electrode 106 is active; and
- the guard electrode 108 is connected to the electrical ground potential G by means of the switch 304: in this configuration the guard electrode is polarized at the electrical ground.

When the control object 102 comes into contact with the detection surface 104, or into immediate proximity with this surface (semi-contact) the capacitance $C_{eo}$ reaches a predetermined threshold value $C_s$ (or a range of threshold capacitances). At that moment, the controllable switch 304 is toggled so as to connect the guard electrode 108 to the ground potential G, as shown in FIG. 3b. In this configuration, a second signal $V_s$ is measured at the output of the OA 110. This second signal $V_s$ is representative of a capacitance $C_T$, called total capacitance, seen by the measurement electrode 106, so that:

$$V_s = V_g C_T / C \qquad (2)$$

This relationship (2) makes it possible to deduce the value of the total capacitance $C_T$ from the measured second signal $V_s$.

Now, the total capacitance $C_T$ corresponds to the sum of:
- the electrode-object capacitance $C_{eo}$, and
- the inter-electrode capacitance $C_{ie}$ which appears between the measurement electrode 106 and the second electrode 108 due to their potential difference.

As the object 102 is in contact with the control surface 104, the electrode-object capacitance $C_{eo}$ no longer varies and is still equal to (or close to) the threshold capacitance $C_s$. Consequently, the value of the inter-electrode capacitance $C_{ie}$, representative of the pressure of the object 102 on the detection surface 104, is obtained by subtraction, according to the following relationship:

$$C_{ie} = C_T - C_s \qquad (3),$$

or $$C_{ie} = C_T - C_{eoT} \qquad (4),$$

Where $C_{eoT}$ is the electrode-object capacitance measured with the object in contact.

In this configuration, it is necessary to verify periodically if the control object 102 is still in contact with the detection surface 104. To this end, the controllable switch 304 is toggled periodically so as to connect the guard electrode 108 to the guard potential $V_g$ in order to measure the electrode-object capacitance $C_{eo}$, then to the ground G in order to measure the total capacitance $C_T$, and thus the inter-electrode capacitance $C_{ie}$. These sequential measurements of $C_{eo}$ and $C_T$ are carried out as long as the electrode-object capacitance is greater than the threshold capacitance ($C_{eo} \geq C_s$).

By using for example the parallel-plate capacitor law, it is possible to link the electrode-object capacitance $C_{eo}$ and the inter-electrode capacitance $C_{ie}$ respectively to a distance between the measurement electrode and the object, and to a distance D between the measurement electrode and the guard electrode. The load can thus be calculated from the variation in the measured thickness D of the dielectric material filling the compressible layer 302, and its modulus of elasticity.

Determination of each of these capacitances from the measured signals can be carried out by the measurement module 114, or by the control module, or even by one or more additional calculation module(s) (not shown).

To this end, it is possible to utilize a synchronous demodulator which carries out multiplication functions of the signal $V_s$ originating from the OA 110 with a carrier signal corresponding to the guard potential $V_g$, then low-pass filtering.

It is also possible to use an asynchronous demodulator comprising a rectification followed by a low-pass filter.

Of course, the use of the controllable switch 118 makes it possible to poll sequentially a plurality of measurement electrodes 106, either individually or by group.

Figure 4:
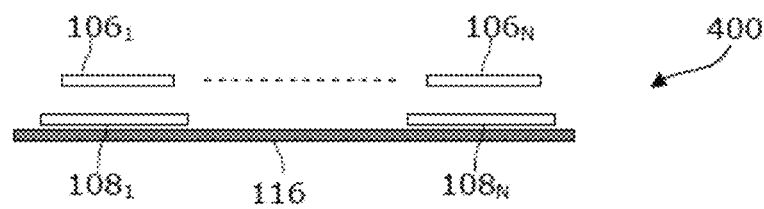
FIGS. 4-10 are diagrammatic representations of different configurations of electrodes that can be implemented in a device according to the invention.

FIG. 4 is a diagrammatic representation of a configuration of electrodes which can be utilized in a device according to the invention.

In the configuration 400, shown in FIG. 4, the device comprises a plurality of measurement electrodes $106_1$-$106_N$. For each measurement electrode $106_1$-$106_N$ the device comprises an individual guard electrode, respectively $108_1$-$108_N$.

The device 400 also comprises a single polarization electrode 116, for all of the measurement electrodes $106_1$-$106_N$. The single polarization electrode 116 is placed below the guard electrodes $108_1$-$108_N$.

Figure 5:
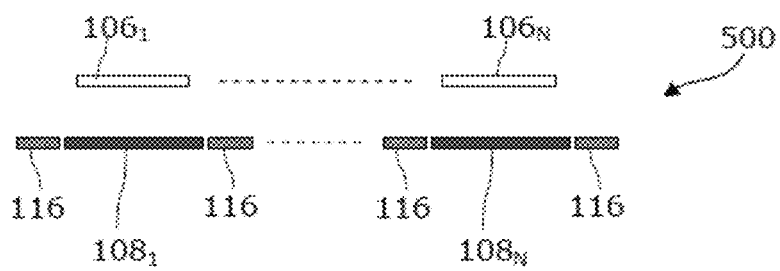

FIG. 5 is a diagrammatic representation of an alternative configuration of electrodes that can be utilized in a device according to the invention.

In the configuration 500, shown in FIG. 5, the device comprises a plurality of measurement electrodes $106_1$-$106_N$. For each measurement electrode $106_1$-$106_N$ the device comprises an individual guard electrode, respectively $108_1$-$108_N$.

Furthermore, the device 500 also comprises a single polarization electrode 116, for all of the measurement electrodes $106_1$-$106_N$.

The single polarization electrode 116 is openwork below each measurement electrode, respectively $106_1$-$106_N$ and each guard electrode, respectively $108_1$-$108_N$, is placed in the openwork part of the single polarization electrode 116.

Figure 6:
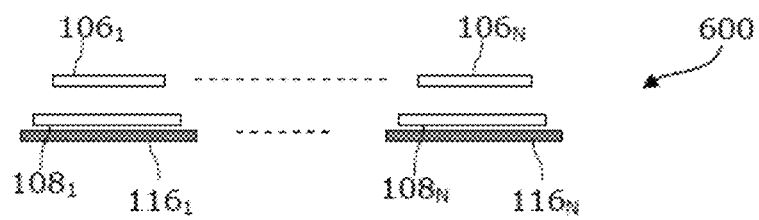

FIG. 6 is a diagrammatic representation of a configuration of electrodes that can be utilized in a device according to the invention.

In the configuration 600, shown in FIG. 6, the device comprises a plurality of measurement electrodes $106_1$-$106_N$. For each measurement electrode $106_1$-$106_N$ the device comprises:
an individual guard electrode, respectively $108_1$-$108_N$; and
an individual polarization electrode, respectively $116_1$-$116_N$.

Each polarization electrode $116_i$ is placed below each guard electrode $108_i$, seen from the measurement electrode $106_i$.

Figure 7:
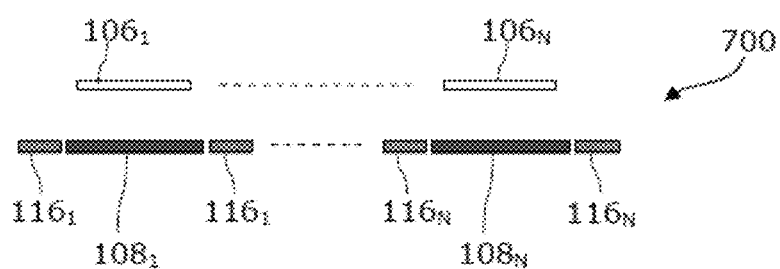

FIG. 7 is a diagrammatic representation of a configuration of electrodes that can be utilized in a device according to the invention.

In the configuration 700, shown in FIG. 7, the device comprises a plurality of measurement electrodes $106_1$-$106_N$. For each measurement electrode $106_1$-$106_N$ the device comprises:
an individual guard electrode, respectively $108_1$-$108_N$; and
an individual polarization electrode, respectively $116_1$-$116_N$.

Each polarization electrode $116_i$ is openwork and each guard electrode $108_i$ is placed in the openwork part of the polarization electrode $116_i$, at the same level as said polarization electrode $116_i$.

Figure 8:
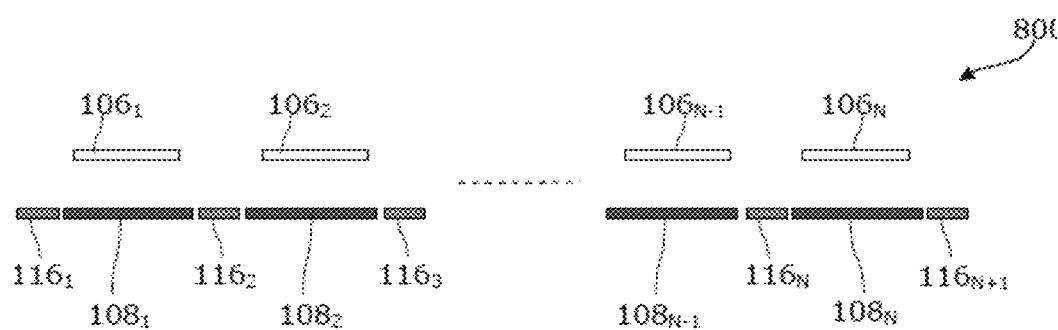

FIG. 8 is a diagrammatic representation of a configuration of electrodes that can be utilized in a device according to the invention.

In the configuration 800, shown in FIG. 8, the device comprises a plurality of measurement electrodes $106_1$-$106_N$. For each measurement electrode $106_1$-$106_N$ the device comprises an individual guard electrode, respectively $108_1$-$108_N$.

The device also comprises (N+1) polarization tracks/electrodes $116_1$-$116_{(N+1)}$, placed at the same level as the guard electrodes $108_1$-$108_N$. Each guard electrode $108_i$, with $1 \leq i \leq N$ is inserted between two polarization tracks $116_i$ and $116_{(i+1)}$.

According to an alternative configuration, the polarization tracks are placed between the guard electrodes only. In other words, the device does not comprise polarization tracks $116_1$ and $116_{(N+1)}$.

Figure 9:
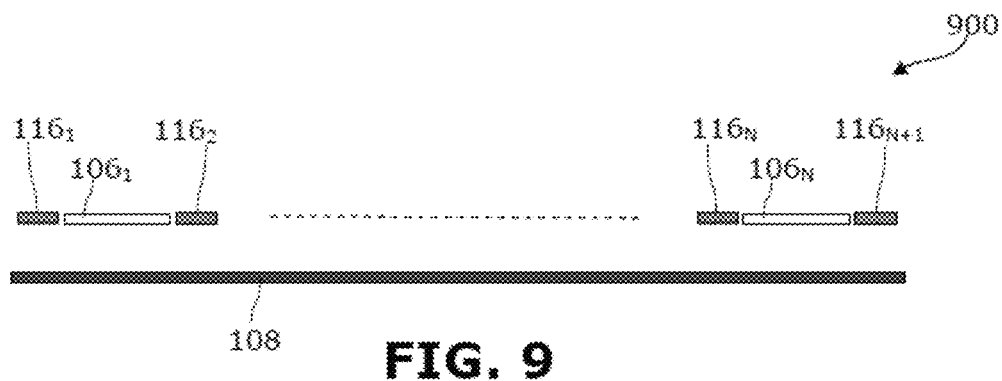

FIG. 9 is a diagrammatic representation of a configuration of electrodes that can be utilized in a device according to the invention.

In the configuration 900, shown in FIG. 9, the device comprises a plurality of measurement electrodes $106_1$-$106_N$. For all of the measurement electrodes $106_1$-$106_N$, the device comprises only one single guard electrode 108, common to the set of measurement electrodes $106_1$-$106_N$.

The device also comprises (N+1) polarization tracks/electrodes $116_1$-$116_{(N+1)}$, placed at the same level as the measurement electrodes $106_1$-$106_N$. Each measurement electrode $106_i$, with $1 \leq i \leq N$ is inserted between two polarization tracks $116_i$ and $116_{(i+1)}$.

Figure 10:
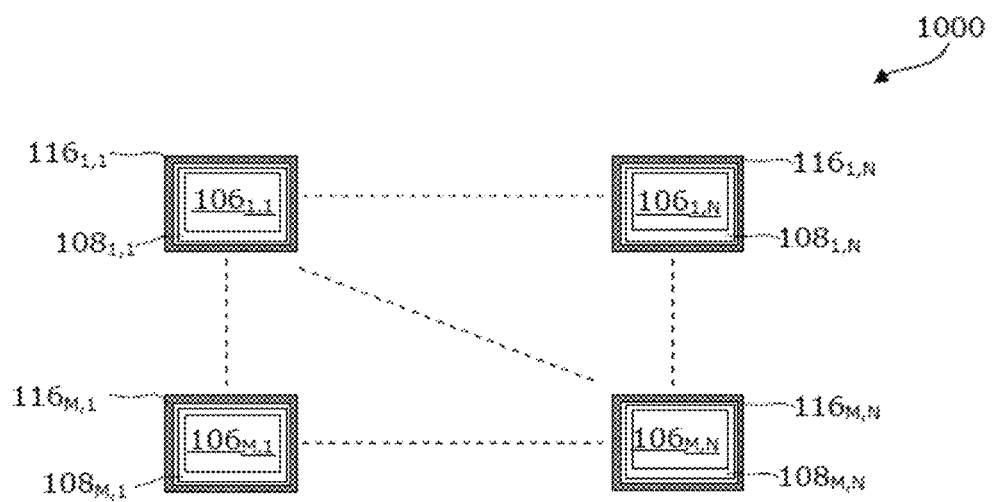

FIG. 10 is a diagrammatic representation of a configuration of electrodes which can be utilized in a device according to the invention.

In the configuration 1000, shown in FIG. 10, the device comprises an array of M rows and N columns of measurement electrodes $106_{i,j}$ with $1 \leq i \leq M$ and $1 \leq j \leq N$. For each measurement electrode, respectively $106_{1,1}$-$106_{M,N}$, the device comprises:
an individual guard electrode, respectively $108_{1,1}$-$108_{M,N}$; and an individual polarization electrode, respectively $116_{1,1}$-$116_{M,N}$.

Each polarization electrode $116_{i,j}$ is openwork and each guard electrode $108_{i,j}$ is placed in the openwork part of the polarization electrode $116_{i,j}$, at the same level as said polarization electrode $116_{i,j}$.

The invention claimed is:

1. A device for detecting an object with respect to a detection surface, said device comprising:
    at least one measurement electrode;
    at least one guard electrode, placed opposite to said at least one measurement electrode, said at least one measurement electrode and said at least one guard electrode being polarized at an alternating guard potential ($V_g$) different from a ground potential (G), and the at least one measurement electrode polarized at either the alternating guard potential or alternating potentials that are identical at at least one given working frequency as the alternating guard potential, and
    at least one module for measuring a first signal with respect to an electrode-object capacitance ($C_{eo}$) formed between said measurement electrode and the object; and
    at least one polarization electrode placed opposite the object, and polarized at the ground potential (G) so as to electrically polarize the object by capacitive coupling,
    wherein the at least one polarization electrode is placed:
        at the same level as the at least one guard electrode, or
        at the same level as the at least one measurement electrode.

2. The device according to claim 1, wherein said at least one polarization electrode is placed opposite, or at the level of, the detection surface.

3. The device according to claim 1, wherein the at least one guard electrode is larger than the at least one measurement electrode.

4. The device according to claim 1, further comprising a plurality of the measurement electrodes and the guard electrodes, wherein the at least one polarization electrode is placed between two adjacent measurement electrodes, and/or between two adjacent guard electrodes.

5. The device according to claim 1, further comprising an individual polarization electrode of the at least one polarization electrode for each measurement electrode of the at least one measurement electrode.

6. The device according to claim 1, further comprising a common polarization electrode of the at least one polarization electrode forming a ground plane for at least two measurement electrodes of the at least one measurement electrode.

7. The device according to claim 1, wherein a guard electrode of the at least one guard electrode is placed in a hole of a polarization electrode of the at least one polarization electrode.

8. The device according to claim 1, further comprising at least one calculation module arranged to calculate:
    the electrode-object capacitance ($C_{eo}$), formed between the at least one measurement electrode and the object as a function of the first signal; and/or
    the distance, or a contact, between the object and the detection surface as a function of said first signal or of said electrode-object capacitance ($C_{eo}$).

9. The device according to claim 1, wherein the at least one measurement electrode is separated from the at least one guard electrode by a distance that is elastically modifiable by a load or a force exerted by the object on said detection surface.

10. The device according to claim 9, wherein the at least one measurement electrode is separated from the at least one polarization electrode and from the at least one guard electrode, by a layer that is elastically compressible comprising a dielectric material.

11. The device according to claim 9, where the at least one measurement module is arranged to measure a second signal with respect to an inter-electrode capacitance ($C_{ie}$), formed between the at least one measurement electrode and the at least one guard electrode, said at least one guard electrode being polarized at a potential different from the alternating potential of the at least one measurement electrode.

12. The device according to claim 11, further comprising at least one calculation module arranged to calculate:
    the inter-electrode capacitance ($C_{ie}$), formed as a function of the second signal; or
    the load or the force applied by the object on the detection surface as a function of said second signal, or of said inter-electrode capacitance ($C_{ie}$).

* * * * *